US006953722B2

(12) United States Patent
Seidl et al.

(10) Patent No.: US 6,953,722 B2
(45) Date of Patent: Oct. 11, 2005

(54) METHOD FOR PATTERNING CERAMIC LAYERS

(75) Inventors: Harald Seidl, Feldkirchen (DE); Martin Gutsche, Dorfen (DE); Thomas Hecht, Dresden (DE); Stefan Jakschik, Dresden (DE); Stephan Kudelka, Ottendorf-Okrilla (DE); Uwe Schröder, Dresden (DE); Matthias Schmeide, Langebrück (DE)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 10/425,461

(22) Filed: Apr. 29, 2003

(65) Prior Publication Data

US 2004/0029343 A1 Feb. 12, 2004

(30) Foreign Application Priority Data

Apr. 29, 2002 (DE) ........................................ 102 19 123

(51) Int. Cl.[7] ........................................ H01L 21/8242
(52) U.S. Cl. ........................ 438/240; 438/253; 438/396
(58) Field of Search ................................ 438/243–249, 438/386–392, 3, 240; 257/301–305

(56) References Cited

U.S. PATENT DOCUMENTS

| | | | | |
|---|---|---|---|---|
| 5,444,007 A | | 8/1995 | Tsuchiaki | |
| 6,054,390 A | | 4/2000 | Liu et al. | |
| 6,177,351 B1 | | 1/2001 | Beratan et al. | |
| 6,204,203 B1 | * | 3/2001 | Narwankar et al. | 438/785 |
| 6,271,075 B1 | | 8/2001 | Fukui | |
| 6,300,202 B1 | | 10/2001 | Hobbs et al. | |
| 6,335,238 B1 | * | 1/2002 | Hanttangady et al. | 438/240 |
| 6,355,519 B1 | * | 3/2002 | Lee | 438/250 |
| 6,426,253 B1 | * | 7/2002 | Tews et al. | 438/243 |
| 6,551,881 B1 | * | 4/2003 | Letavic | 438/267 |
| 6,586,348 B2 | * | 7/2003 | Hartner et al. | 438/785 |
| 6,602,714 B1 | * | 8/2003 | Tagge et al. | 436/2 |
| 2003/0230549 A1 | * | 12/2003 | Buchanan et al. | 216/41 |
| 2004/0063321 A1 | * | 4/2004 | Goebel et al. | 438/689 |

FOREIGN PATENT DOCUMENTS

| | | |
|---|---|---|
| DE | 198 51 280 A1 | 5/2000 |
| DE | 101 15 912 A1 | 10/2002 |
| EP | 0 378 782 B1 | 6/1994 |
| JP | 60156547 A | 8/1985 |

OTHER PUBLICATIONS

Braun et al. High–k Materials Challenge Deposition, Etch and Metrology, Nov. 1, 2002, Semiconductor International, pp. 1–6.*

* cited by examiner

*Primary Examiner*—Jennifer M. Kennedy
(74) *Attorney, Agent, or Firm*—Laurence A. Greenberg; Werner H. Stemer; Ralph E. Locher

(57) ABSTRACT

In a method for forming patterned ceramic layers, a ceramic material is deposited on a substrate and is subsequently densified by heat treatment, for example. In this case, the initially amorphous material is converted into a crystalline or polycrystalline form. In order that the now crystalline material can be removed again from the substrate, imperfections are produced in the ceramic material, for example by ion implantation. As a result, the etching medium can more easily attack the ceramic material, so that the latter can be removed with a higher etching rate. Through inclined implantation, the method can be performed in a self-aligning manner and the ceramic material can be removed on one side, by way of example, in trenches or deep trench capacitors.

11 Claims, 7 Drawing Sheets

METHOD FOR PATTERNING CERAMIC LAYERS

BACKGROUND OF THE INVENTION

Field of the Invention

Economic success in the semiconductor industry is significantly influenced by further reduction of the minimum feature size that can be produced on a microchip. Reducing the minimum feature size makes it possible to increase the integration density of electronic components such as transistors or capacitors on the microchip and thus to increase the computing speed of processors and also to increase the storage capacity of memory modules. In order to keep down the area requirement of the components on the chip surface, the depth of the substrate is also utilized in the case of capacitors. For this purpose, a trench is introduced into a silicon wafer. Afterward, a bottom electrode is produced, for example by the regions of the wafer that adjoin the wall of the trench being doped in order to increase the electrical conductivity. A thin layer of a dielectric is then applied to the bottom electrode. Finally, the trench is filled with an electrically conductive material in order to obtain a counter electrode. The counter electrode is also referred to as a top electrode. This configuration of electrodes and dielectric results in that the capacitor is virtually folded. Given electrode areas of uniform size, that is to say the same capacitance, it is possible to minimize the lateral extent of the capacitor on the chip surface. Such capacitors are also referred to as "deep trench" capacitors. At the present time, deep trench capacitors can be fabricated with an aspect ratio of up to 60, given a diameter of the trench at the surface of the substrate of down to 100 nm. An aspect ratio is understood to be the ratio of the depth of the trench perpendicular to the substrate surface to the diameter of the opening of the trench at the substrate surface.

In memory chips, the charged and the discharged state of the capacitor correspond to the two binary states 0 and 1. In order to be able to reliably determine the charge state of the capacitor and thus the information stored in the capacitor, the latter must have a specific minimum capacitance. If the capacitance or, in the case of a partly discharged capacitor, the charge falls below this limit value, the signal vanishes in the noise, that is to say the information about the charge state of the capacitor is lost. After the writing process, the capacitor is discharged through leakage currents that bring about charge equalization between the two electrodes of the capacitor. With decreasing dimensions, leakage currents increase since tunneling effects gain in importance. In order to counteract a loss of information through the discharging of the capacitor, the charge state of the capacitor is checked at regular intervals and, if appropriate, refreshed, that is to say a partially discharged capacitor is charged up to its original state again. However, technical limits are imposed on these so-called "refreshing" times, in other words they cannot be arbitrarily shortened. Therefore, in one period of the refreshing time, the charge of the capacitor is only permitted to decrease to such an extent that reliable determination of the charge state is possible. For a given leakage current, the capacitor must therefore have a specific minimum charge at the beginning of the refreshing time, so that, at the end of the refreshing time, the charge state is still high enough above the noise in order to be able to reliably read out the information stored in the capacitor.

A multiplicity of solution approaches are pursued in order to be able to ensure a reliable storage of the information even with advancing miniaturization. Thus, by way of example, the surface of the electrodes is provided with a structure in order that, as the length and width of the electrodes decrease, the surface of the electrodes is made as large as possible. Furthermore, new materials are used. Thus, at the present time, polysilicon is used as an electrode material for filling the trench. With further miniaturization, that is to say a smaller diameter of the trench, the layer thickness of the conductive material decreases, so that the electrical conductivity of the polysilicon is insufficient for providing the required charge. In order to combat a loss of capacitance of the capacitors with advancing miniaturization, instead of the electrodes made of doped polysilicon that are used at the present time, use is made of electrodes made of metals having a higher electrical conductivity, for example platinum. As a result, it is possible to suppress depletion zones in the electrodes and thus to fabricate thinner electrodes which nevertheless provide the required charge density on the electrodes.

Furthermore, attempts are being made to replace the silicon dioxide that is generally used as dielectric and is disposed between the electrodes by materials having a higher dielectric constant $\in$. Given the same electrode area and the same electrode spacing, that capacitor which contains a dielectric having a higher dielectric constant has the higher capacitance. Conversely, this means that, given a constant electrode spacing, through the use of a dielectric having a higher dielectric constant, given the same capacitance, the electrode area can be reduced and the capacitor can thus also be miniaturized further in its dimensions. Many metal oxides and transition metal oxides, such as, for example, $Al_2O_3$, $Ta_2O_5$, $HfO_2$, $ZrO_2$, $Y_2O_3$, $TiO_2$, $Nb_2O_5$, $NoO_3$, $La_2O_3$, $Gd_2O_3$, $Nd_2O_3$, $Pr_2O_3$, and also mixed oxides or silicates containing them, such as $HfO/SiO_2$, for example, of variable composition, have high values for the dielectric constant that makes them appear suitable for an application as dielectric in microelectronic components. Thus, by way of example, $Ta_2O_3$ has dielectric constants in the range of from 20 to 23.

A further departure point for advancing miniaturization is the configuration of the memory cell. In dynamic random access memories (DRAMs) a memory is represented by a "one-transistor cell". The latter contains one transistor that connects a storage capacitor to the bit line. If the capacitor is embodied as a trench capacitor, the assigned transistor may be disposed on the substrate surface or likewise in the trench. The construction of such a memory cell requires a large number of work steps, the individual layers having to be patterned after their deposition in order, by way of example, to be able to provide passages for the configuration of conductive connections. In the introduction of new dielectric materials, a significant difficulty consists in the lack of patternability of these materials. The dielectric is generally applied by chemical vapor deposition (CVD) or atomic layer deposition (ALD) since these methods make it possible to achieve a uniform thickness of the ceramic layer even in structures with a high aspect ratio, as are used for example as trenches for the construction of deep trench capacitors. The dielectric is produced from gaseous precursors from which the desired dielectric is produced as a ceramic layer in a chemical reaction. In the case of the CVD method, the precursors are simultaneously present in the vapor phase above the substrate, the dielectric being deposited directly on the substrate surface as a result of a reaction of the gaseous precursors. In the case of the ALD method, the precursors are in each case introduced into the gas space individually one after the other, so that in each case only one of the precursors reacts with chemical groups, for example hydroxyl groups, provided on the substrate surface. The layer of the dielectric is in this case built up step by step in individual atomic layers, with the result that the layer thickness can be controlled very precisely. However, after its deposition, the layer of the dielectric still exhibits poor electrical properties since the layer has an amorphous structure, for example, or the layer still contains groups containing incompletely converted precursors. These imperfections lead to high leakage currents and thus to unsatisfactory electrical properties of the capacitor.

After deposition, the layer of the dielectric is therefore first densified. For this purpose, the dielectric is generally subjected to heat treatment, thereby annealing imperfections in the layer. In this case, the dielectric usually undergoes transition from an amorphous structure to a crystalline or polycrystalline structure. The ceramic layer of the dielectric also acquires a higher resistance toward chemicals as a result of the heat treatment. Thus, the ceramic layer of the dielectric can be removed again directly after deposition using an etching medium without relatively great difficulties. After the heat treatment, virtually no reaction with the etching medium takes place any longer, or very long process times are required in order to remove the layer of the dielectric again.

Thus, "Monthly Report of the Gate Stack Thin Film Program, August 2001, Post Edge Activity" reports that the etching rate of HF on crystalline $Al_2O_3$ is 0.1 nm/min. "Monthly Report of FEP Surface Preparation, August 2001, Post Gate Edge Activity" reports on investigations in which etching rates for annealed $HfO_2$ in 49% strength HF solution of 0.001 nm/min were obtained. Without additional heat treatment, the ceramic layers were able to be etched relatively well directly after deposition. Thus, $Al_2O_3$ can be removed directly after deposition using 49% HF with an etching rate of 10 nm/min.

If dielectrics having a high dielectric constant $\in$, so-called high-k materials, are used for the construction of capacitors, it has therefore been necessary hitherto to make a compromise since either amorphous, well patternable ceramic layers with poor electrical properties or crystalline or polycrystalline, poorly patternable ceramic layers with good electrical properties are available. A complex configuration of electronic components that requires a patterning of ceramic layers can therefore be realized only with difficulty.

SUMMARY OF THE INVENTION

It is accordingly an object of the invention to provide a method for patterning ceramic layers that overcomes the above-mentioned disadvantages of the prior art methods of this general type, which have good electrical properties, that is to say permit only low leakage currents.

With the foregoing and other objects in view there is provided, in accordance with the invention, a method for patterning ceramic layers on semiconductor substrates. The method includes providing a semiconductor substrate, depositing a ceramic layer on the semiconductor substrate, densifying the ceramic layer in a densification step resulting in a densified ceramic layer, producing imperfections at least in sections in the densified ceramic layer, and treating the densified ceramic layer with an etching medium for removing the densified ceramic layer from the semiconductor substrate in the sections provided with the imperfections.

Thus, by the method according to the invention, a high-quality ceramic layer is produced and imperfections are produced in those sections of the ceramic layer that are intended to be removed later. As a result of the production of imperfections, the ceramic layer, which has a high quality after densification, that is to say e.g. permits only low leakage currents, is converted again into a form which enables an attack of the etching medium, and thus a removal of the ceramic layer with etching rates that are suitable for industrial application. Since, during etching, those sections of the ceramic layer in which no imperfections have been produced are not attacked by the etching medium, or are attacked at least to a considerably smaller extent, the method according to the invention has made it possible to pattern ceramic layers, a high-quality ceramic layer being available after the patterning. This opens the way to more complex configurations of memory cells, such as e.g. memory cells.

All disturbances of the ceramic layer that lower the resistance thereof toward an etching medium are regarded as imperfections. Examples of such imperfections are impurity atoms or ions that are incorporated into the ceramic layer, disorders in the crystal lattice of the ceramic material, or else amorphous regions within a crystalline or polycrystalline ceramic material. In order to differentiate the state after the production of imperfections from the amorphous state that is obtained directly after the deposition of the ceramic material, the state after the production of imperfections is referred to hereinafter as "quasi-amorphous" state and the ceramic material as "quasi-amorphous" ceramic material. The precise structure of such a quasi-amorphous state has not yet been determined. However, the inventors assume that a quasi-amorphous material has the imperfections described above. Macroscopically, the quasi-amorphous state produced by the method according to the invention differs from a crystalline or polycrystalline state by virtue of the better etchability or the higher etching rate during the removal of the ceramic layer by an etching medium.

Such a quasi-amorphous state of the ceramic layer can be produced in various ways. Thus, by way of example, a doping may be introduced into the layer during the deposition of the ceramic layer. An example of a suitable doping is hydrogen which, according to CVD and ALD methods, is contained in the ceramic layers, for example $Al_2O_3$ layers. During the densification of the deposited ceramic layer in a heat treatment step, gaseous hydrogen can be added to the furnace atmosphere, so that an outdiffusion of the hydrogen is prevented or at least reduced. The ceramic layer can then be removed by use of an etching medium in uncovered regions, whereas it can remain on the substrate in regions which are protected for example by a mask or components of the electronic component to be produced. In a later work step, the dopant can then be driven out from the protected regions, so that the electrical quality of the ceramic layer satisfies the high requirements desired.

However, the method according to the invention is preferably carried out in such a way that the imperfections are subsequently produced in the densified ceramic layer. For this purpose, the deposited ceramic layer is first densified, for example by being subjected to heat treatment. The ceramic layer then has a good quality throughout, that is to say good electrical properties and a high resistance toward etching media. The sections of the ceramic layer that are to be removed are then treated with an implant species that produces imperfections in the densified ceramic layer. In this case, the term implant species denotes any atom, molecule or ion that has a sufficiently high energy to bring about a chemical or physical alteration of the ceramic layer. The particles of the implant species may be present in neutral or charged form, as atoms or else as molecules. There are no particular limitations here, provided that the implant species can bring about a chemical or physical alteration of the ceramic layer that increases the etchability of the ceramic layer. The resistance of the ceramic layer toward etching media can be selectively reduced in this way in specific sections of the ceramic layer. After the patterning, the ceramic layer can therefore be used e.g. as a mask for the etching of the substrate disposed below the ceramic layer.

In accordance with a preferred embodiment, the implant species is incorporated into the densified ceramic layer by ion implantation. Depending on the type and energy of the implanted particles, by way of example, the particles can be incorporated into the crystal lattice of the ceramic material, thereby providing an imperfection for the attack of the etching medium, or the crystal lattice or the densified structure of the ceramic layer can also be converted into a quasi-amorphous form again by the kinetic energy of the particles. The ion implantation can be carried out e.g. using a focused ion beam, as a result of which a relatively large area of the ceramic material can be altered in its structure for example only section by section as a result of writing using the ion beam. This enables very fine patterning of the ceramic layer, so that the method according to the invention also enables the fabrication of masks for the processing of a semiconductor substrate.

For the implantation, it is possible to use, for example, hydrogen (H, $H_2$), nitrogen (N, $N_2$) or arsenic (As) or else molecules such as $AsH_3$, $AsH_2^+$, $PH_3$, $PH_2^+$. However, materials other than those mentioned can also be used. For the implantation, the dose is usually chosen in a range of from $1\times10^{13}$ to $1\times10^{17}$ at/cm$^2$ and the energy in a range of from 100 eV to 2 MeV. The implantation of the ions is carried out by customary apparatuses.

In accordance with a further preferred embodiment, the implant species is provided by plasma. Hydrogen plasma, for example, is suitable. However, it is also possible to use other elements or compounds for producing the plasma. The plasma can bring about an alteration of the structure in the uncovered regions of the ceramic layer by virtue of the plasma reacting with the constituents of the ceramic layer or by virtue of doping elements from the plasma being incorporated into the ceramic layer. The ceramic layer is converted from a crystalline or polycrystalline state into a quasi-amorphous state and can therefore be attacked more easily by an etching medium, which leads to higher etching rates.

Customary etching media may be used for etching the ceramic layer, for example HF, cold $H_3PO_4$ or SC1 (SC1= Standard Clean 1; a mixture of $H_2O/NH_4OH/H_2O_2$ which is usually used as an etching medium). Other etching media may also be used in addition to the etching media mentioned.

The implant species can act isotropically on the ceramic layer, as a result of which the ceramic layer can be altered uniformly in its resistance toward etching media largely independently of its geometry. Such an isotropic action of the implant species on the ceramic layer may be brought about by use of isotropic plasma, for example.

For specific applications, however, it may be advantageous for the implant species to act anisotropically on the ceramic layer. For this purpose, the implant species is applied to the densified ceramic layer in a manner directed at an angle to the normal to the semiconductor substrate surface. This is advantageous if the surface of the semiconductor substrate contains elements having a high aspect ratio, for example trenches or trench capacitors. In this case, parts of the ceramic surface are shaded from the action of the implant species, so that a selective modification of specific sections of the ceramic layer is made possible. Thus, by way of example, in the event of inclined incidence of an ion beam, the ceramic layer can be modified on one side in a trench, while the opposite wall of the trench is shaded from the incident particles and is thus not modified in its resistance toward an etching medium. In this way, by way of example, it is possible to fabricate a contact on one side in a trench through selective removal of the ceramic layer, while the opposite side of the trench remains covered by the layer of the insulating dielectric.

The depth to which the ceramic layer is to be removed in a trench, for example, can be controlled through the angle of incidence of the incident implant species. The larger the angle to the normal to the surface is chosen to be, the smaller the penetration depth of the implant species. Preferably, the angle between the direction of incidence of the implant species and the normal to the substrate surface is chosen in a range of from 89° to 1°, preferably from 89° to 30°.

A selective patterning of the ceramic layer through the shading of specific regions has been explained here on the basis of trenches introduced into a substrate. However, such a selective patterning can be applied quite generally to substrates with an uneven topography. Thus, a selective patterning can also be carried out with substrates having elevated structures, for example the patterning of a gate oxide. Here, too, the ceramic layer remains, after etching, in the regions that were shaded by the elevated structure during inclined incidence of the implant species.

For a selective removal of the ceramic layer in the sections provided with imperfections, it is essential that the behavior of the ceramic layer is as different as possible with respect to an etching medium in the sections provided with imperfections and in the unmodified sections. In order to obtain a high resistance of the densified ceramic layer toward an etching medium in the non-modified sections, the ceramic layer, for densification, is preferably converted into a crystalline or polycrystalline form. For process engineering reasons, the ceramic layer is preferably densified by heat treatment. For this purpose, the ceramic layer or the substrate is heated to a temperature that lies above the crystallization temperature of the relevant ceramic material. It is not necessary in this case for the ceramic layer to be completely crystallized through. However, the heat treatment is preferably carried out for a sufficient length of time that the electrical properties, that is to say the insulation effect of the ceramic layer, are sufficient for the relevant application or the ceramic layer requires a sufficient resistance toward an etching medium. The densification of the amorphous ceramic layer has been explained here using the example of a heat treatment step. However, other methods may likewise be used. What is essential is that the ceramic layer is converted into a state with high etching resistance as a result of the treatment.

The removal of the densified ceramic layer provided with imperfections is preferably effected by wet-chemical methods. HF, SC1, cold $H_3PO_4$, for example, are suitable. In this case, the etching medium is selected such that, if possible, only the modified quasi-amorphous sections of the ceramic layer that are provided with imperfections are attacked.

As already explained, a selective modification of the ceramic layer can be achieved through shading of specific regions as a result of an inclined incidence of the implant species on the substrate surface. Therefore, in a preferred embodiment of the method according to the invention, for the fabrication of trench capacitors, trenches having walls are introduced into the semiconductor substrate, the ceramic layer is deposited onto the walls and is subsequently densified. The implant species is then applied at an inclination with respect to the normal to the substrate surface, so that imperfections are produced only in sections of the ceramic layer deposited on the trench wall. During the subsequent etching, only the modified quasi-amorphous sections of the ceramic layer are selectively removed and the semiconductor substrate uncovered. This makes it possible to fabricate a contact only on one side of the trench, while the insulating effect of the ceramic layer is preserved on the opposite side. This opens up the way to a novel configuration e.g. of transistors for memory cells.

The method according to the invention is suitable per se for the patterning of arbitrary ceramic layers. For a miniaturization of electronic components, in particular capacitors, however, it is preferred for the ceramic layer to be composed of a material of high permittivity. Preferred materials of high permittivity are, for example, materials selected from the group formed from $Al_2O_3$, $Ta_2O_5$, $ZrO_2$, $HfO_2$, $TiO_2$, oxides of the lanthanides, where the oxides can be used by themselves or as mixed oxides.

In particular during ion implantation, ions are incorporated into the ceramic layer as implant species that can bring about a modification of the chemical behavior of the ceramic material. What are preferably used in this case are implant species that contain heavy elements that bring about a chemical alteration of the ceramic layer. In this case, heavy elements are understood to be, in particular, elements of the third or fourth period of the periodic table.

In a further preferred embodiment of the method according to the invention, a further layer made of a further material is disposed below the ceramic layer. The further material is not inherently subject to any particular restrictions. A ceramic material, for example, may be used as the further material. However, it is also possible to use a layer made of a metal or a semiconductor material as the further material. The ceramic layer disposed at the top can be modified in its resistance toward an etching medium by a treatment with an implant species. Then, during etching, first the ceramic layer lying on top is removed and the layer made of the further material disposed underneath is uncovered. During the further etching, the layer made of the further material is then selectively attacked and removed only in the uncovered regions. The layer made of the further material disposed below the ceramic layer may be formed for example by a collar of a capacitor. However, the layer made of the further material lying at the bottom may also be used in a manner similar to a bottom resist used in photolithographic methods for patterning semiconductor substrates, the ceramic layer disposed at the top first being modified section by section by the implant species and, in the subsequent etching step, the structure produced in the ceramic layer being transferred to the layer made of the further material disposed at the bottom. In this way, the ceramic layer can be made very thin, as a result of which it can be modified more easily in its resistance toward an etching medium.

Other features which are considered as characteristic for the invention are set forth in the appended claims.

Although the invention is illustrated and described herein as embodied in a method for patterning ceramic layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
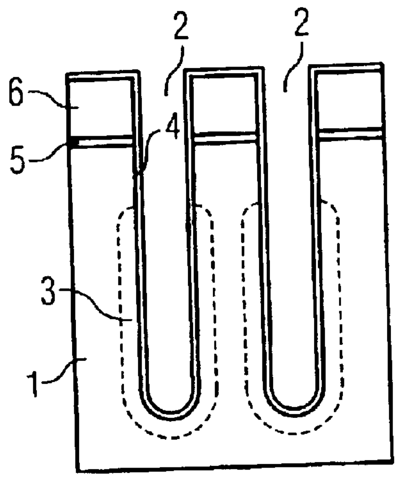
FIGS. 1A–1E are diagrammatic, sectional views showing work steps for fabricating a deep trench capacitor, a collar being produced after the deposition of a ceramic layer acting as a dielectric according to the invention.
Figure 1B:
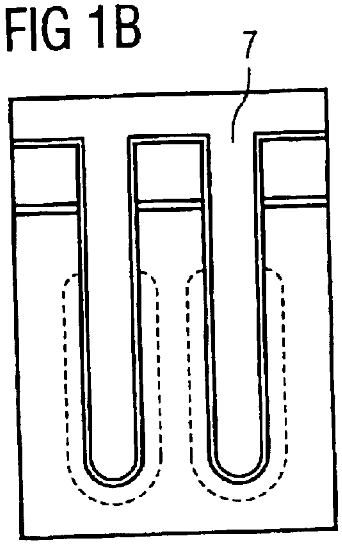
Figure 1C:
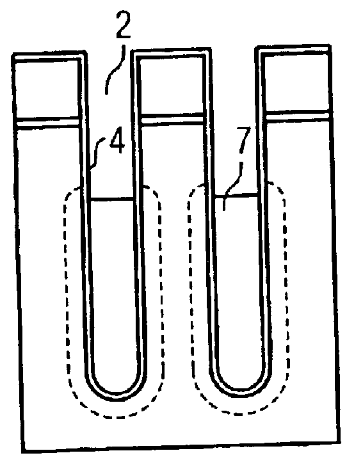
Figure 1D:
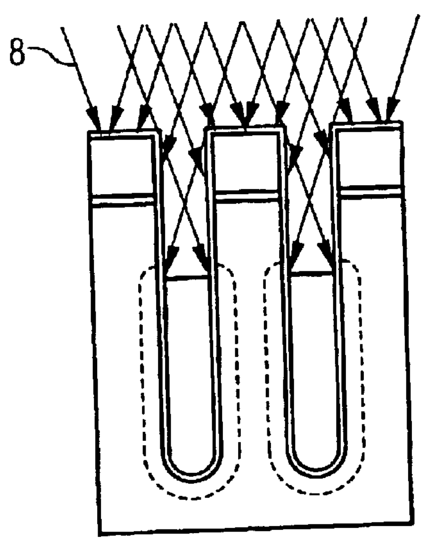
Figure 1E:
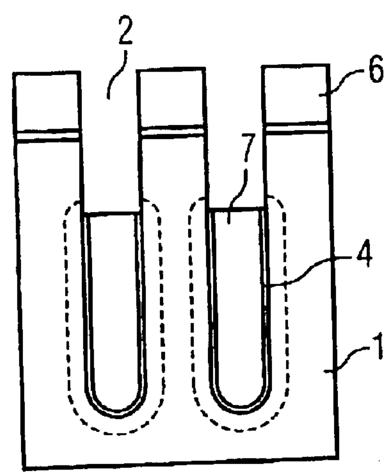

Referring now to the figures of the drawing in detail and first, particularly, to FIGS. 1A–1E thereof, there is shown work steps which are run through during the fabrication of a deep trench capacitor. In order to attain a construction illustrated in FIG. 1A, a silicon wafer 1 is oxidized at its surface in an oxygen atmosphere in order to produce a thin oxide layer 5 having a thickness of about 5 nm. The oxidation on the one hand reduces stresses in the wafer and on the other hand provides an adhesion layer for further layers. A nitride layer 6 having a thickness of approximately 200 nm is subsequently deposited on the oxide layer by a CVD method. For the patterning of the nitride layer 6, first a layer made of a hard mask material is then deposited, for example a borosilicate glass. Afterward, a photoresist is applied, exposed section by section with the aid of a mask and developed using a developer in order to define openings having a diameter of approximately 100 nm for the trenches of the trench capacitor. The openings are then transferred into the layer of the hard mask using a fluorine-containing plasma, the uncovered sections of the nitride layer 6 also being removed at the same time. After the removal of the photoresist layer, a trench 2 is etched into the silicon wafer 1 as far as a depth of approximately 8 $\mu$m using further fluorocarbon plasma. Finally, the hard mask is removed using hydrofluoric acid, for example. In further work steps, sections 3 of the silicon wafer which adjoin the trenches 2 are doped in order to improve the conductivity. This can be done for example by vapor phase doping with arsenic. However, other doping methods can likewise be employed. The doped region 3 of the silicon wafer 1 acts as a bottom electrode in the complete capacitor. A thin ceramic layer 4 of a dielectric, for example $Al_2O_3$, is then deposited in the trench 2 by an ALD method. ALD methods produce a uniform layer thickness. However, it is also possible to use other methods for the deposition of the ceramic layer, e.g. a CVD method. Afterward, heat treatment is affected, the substrate being heated to a temperature of at least 800° C. In this case, the $Al_2O_3$ initially deposited in amorphous form is converted into a crystalline or polycrystalline form. The semiconductor substrate now has the construction shown in FIG. 1A. The illustration corresponds to a section through a silicon wafer parallel to the longitudinal axes of the introduced trenches 2 or perpendicular to the top-side of the silicon wafer 1. The trenches 2 are introduced into the silicon wafer 1, the doped region 3 being provided in the lower region of the trenches 2 in the silicon wafer, which doped region has an increased electrical conductivity and corresponds to the bottom electrode in the completed capacitor. The trenches 2 are lined with a layer 4 of the dielectric e.g. $Al_2O_3$, which covers the inner walls of the trenches 2 and the top-side. First, the above-mentioned layer 5 made of silicon dioxide is disposed directly on the silicon wafer 1, on the top side thereof, and the layer 6 made of silicon nitride is in turn disposed on the layer 5. The silicon nitride layer 6 is covered by the layer 4 of the dielectric, which also covers the walls of the trenches 2. The trenches 2 are then completely filled with polysilicon 7, the polysilicon 7 also completely covers the surface of the semiconductor substrate. This state is illustrated in FIG. 1B. The trenches 2 are completely filled with the polysilicon 7, which also covers the top side of the semiconductor substrate illustrated. The polysilicon 7 is then etched back anisotropically by use of plasma, so that the polysilicon 7 is removed again on the surface of the semiconductor substrate and also in the upper section of the trenches 2. The construction shown in FIG. 1C is attained. The trenches 2 are filled with polysilicon 7 in their lower section, while the polysilicon 7 is removed in the upper section of the trenches 2. The ceramic layer 4 made of the dielectric is now uncovered again in the upper section and also on the top-side of the semiconductor substrate. In order that the ceramic layer 4 can be removed again in the uncovered regions, ions are implanted into the ceramic layer 4. This operation is illustrated diagrammatically in FIG. 1D, the direction of incidence of the ions being represented by arrows 8. As a result of the implantation of ions, the structure of the ceramic layer 4 of the dielectric is altered and the dielectric undergoes transition from its (poly)crystalline, difficult-to-etch form into a quasi-amorphous, easy-to-etch form again. Since the incident ions have no preferred direction 8 or the silicon wafer 1 is rotated during the ion implantation, the ceramic layer 4 of the dielectric is modified uniformly in all uncovered regions. Afterward, an etchant is applied to the surface of the semiconductor substrate, for example HF, in order to remove the modified quasi-amorphous regions of the ceramic layer 4. The construction illustrated in FIG. 1E is obtained. The trenches 2 are filled with the polysilicon 7 in their lower region, a ceramic layer 4 of the dielectric being disposed between the polysilicon 7 and the silicon wafer 1. The material of the silicon wafer 1 is uncovered again in the upper region of the trenches 2. In further steps, it is then possible to construct a collar in the upper section of the trenches 2. A connection to a transistor by which the charge state of the capacitor can be controlled is fabricated later at the upper edge of the collar.

Figure 2A:
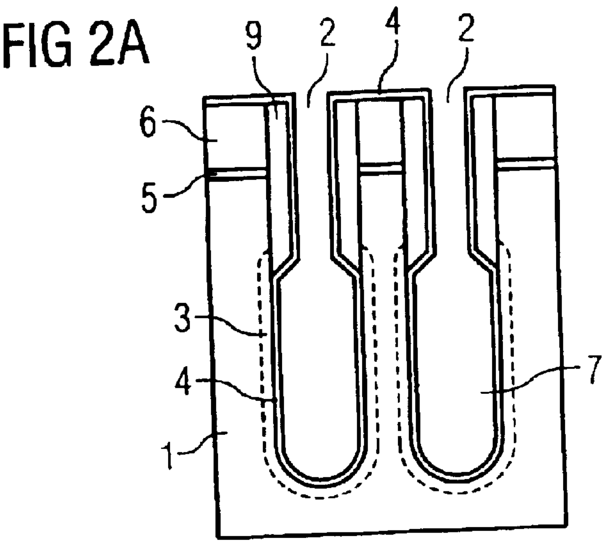
FIGS. 2A–2C are diagrammatic, sectional views showing work steps for fabricating the deep trench capacitor, the ceramic layer acting as the dielectric deposited after the construction of the collar.
Figure 2B:
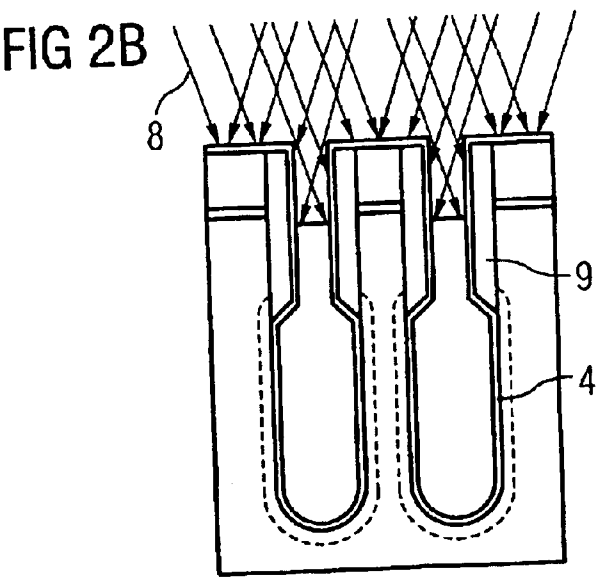
Figure 2C:
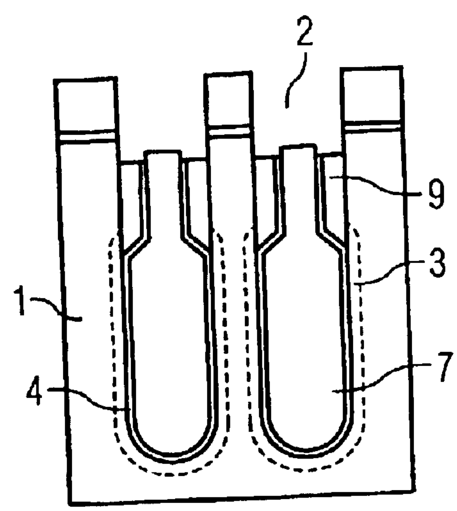

FIGS. 2A–2C shows work steps for the fabrication of the deep trench capacitor. In this case, a collar is produced and only afterward is the ceramic layer 4 made of a high-k material deposited. For this purpose, the silicon wafer 1 is processed in the manner described for FIG. 1A in order to deposit the thin $SiO_2$ layer 5 and also the silicon nitride layer 6 on the wafer and subsequently to introduce trenches into the semiconductor substrate 1. After the trenches 2 have been introduced into the silicon wafer 1, the thin oxide layer having a thickness of approximately 10 nm is produced on the wall of the trenches by the uncovered silicon being thermally oxidized with oxygen. Polysilicon 7 is subsequently deposited on the wafer, so that the trenches are completely filled with polysilicon. The polysilicon 7 is etched back anisotropically in order to remove the polysilicon 7 again from the surface of the wafer and also in the upper section of the trenches 2 as far as a depth of 1 $\mu$m. The uncovered oxide layer is isotropically etched away again at the uncovered sections in the upper region of the trench wall. An insulating layer 9 made of an oxide/nitride film and having a thickness of approximately 20 nm is then deposited and the oxide/nitride film 9 is subsequently etched anisotropically, so that the surface of the polysilicon previously deposited in the trenches is uncovered again. The polysilicon still present in the trenches is then removed again by isotropic etching, so that the trenches 2 are uncovered again down to their entire depth. After the thin oxide film produced below the polysilicon on the wall of the trench has also been removed again by isotropic etching, for example using hydrofluoric acid, the regions 3 of the silicon wafer 1 which are uncovered in the trenches are doped in order to approve the conductivity. This may be done for example likewise by vapor phase doping with arsenic. As the dielectric, the ceramic layer 4 made of $Al_2O_3$ and having a thickness of approximately 5 nm is then deposited and subsequently densified. In order to fabricate the top electrode, the polysilicon 7 is then deposited again into the inner space of the trenches 2 and the polysilicon 7 disposed on the surface of the semiconductor substrate and also in the upper regions of the trenches 2 is subsequently etched back isotropically again. A configuration illustrated in FIG. 2A is attained.

The trenches 2 are introduced into the silicon wafer 1 on whose top-side the thin layer 5 made of $SiO_2$ and also the layer 6 made of silicon nitride are disposed. In the lower region of the trenches 2, the silicon wafer 1 has the region 3 which is doped in order to increase the electrical conductivity. The oxide/nitride layer 9 is disposed in a collar-like manner in the upper region in the trenches 2 and forms a so-called collar. The inner walls of the trenches 2 and also the upper side of the semiconductor substrate are covered with the ceramic layer 4 made of the dielectric, in this case made of $Al_2O_3$. The inner space of the trenches 2 is filled with polysilicon 7, the polysilicon 7 having been removed again in the topmost section of the trenches 2 and the inner space of the trenches 2 having been uncovered again.

The ceramic layer 4 of the dielectric then has to be removed again in the uncovered regions of the trenches 2. For this purpose, the substrate is irradiated with implant particles, the path of which is illustrated symbolically by the arrows 8. The ion bombardment alters the structure of the ceramic layer 4 of the dielectric, the latter being converted for example from a crystalline form into a quasi-amorphous form again. The quasi-amorphous sections of the ceramic layer 4 of the dielectric can then be removed in an isotropic etching step, for example wet-chemically, using HF. Since the material of the collar 9 is no longer protected by the layer 4 of the dielectric in these regions, the oxide/nitride layer 9 is likewise removed in the upper region of the trenches 2. A construction shown in FIG. 2C is attained. The inner space of the trenches 2 is uncovered again in the upper section since the material of the collar 9 and of the ceramic layer 4 as dielectric has been removed again there. In their lower part, the trenches 2 are filled with the polysilicon 7, the ceramic layer 4 of the dielectric being disposed between the polysilicon 7 and the doped regions 3 of the silicon wafer 1.

In the upper region, the polysilicon 7 is surrounded by the collar 9 in a collar-like manner. In the subsequent work steps, it is then possible for the transistor to be constructed and also for the top electrode formed from the polysilicon 7 to be electrically connected.

Figure 3A:
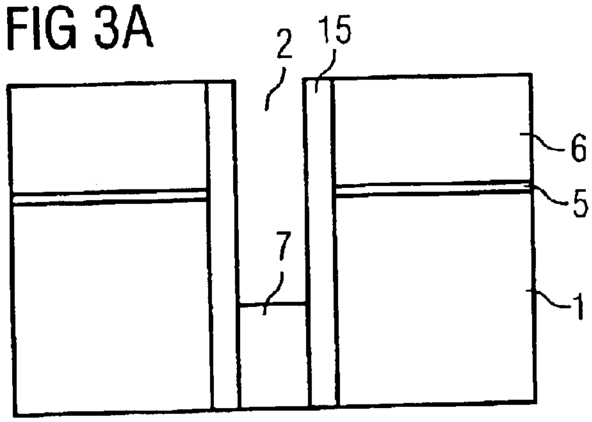
FIGS. 3A–3F are diagrammatic, sectional views showing work steps for constructing a one-sided buried strap using a liner, the capacitor being constructed in accordance with the method steps illustrated in FIG. 1.
Figure 3B:
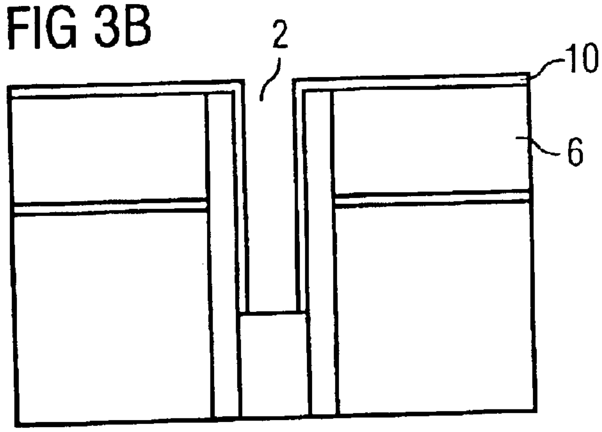
Figure 3C:
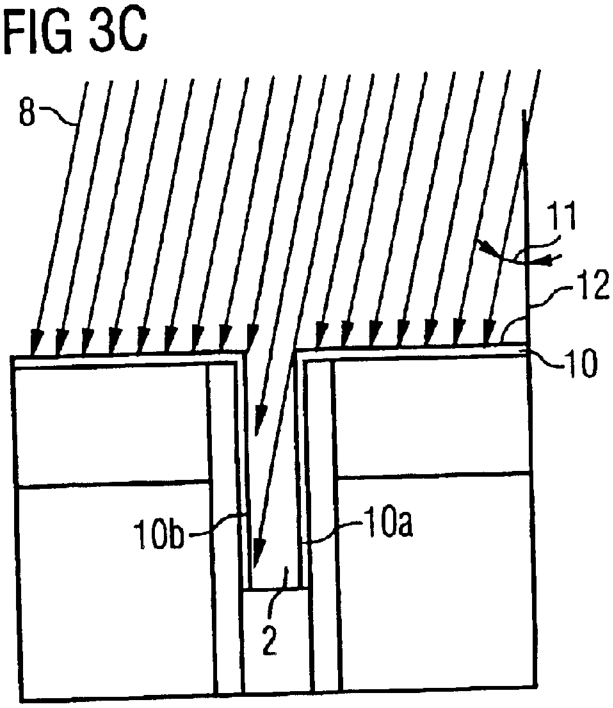
Figure 3D:
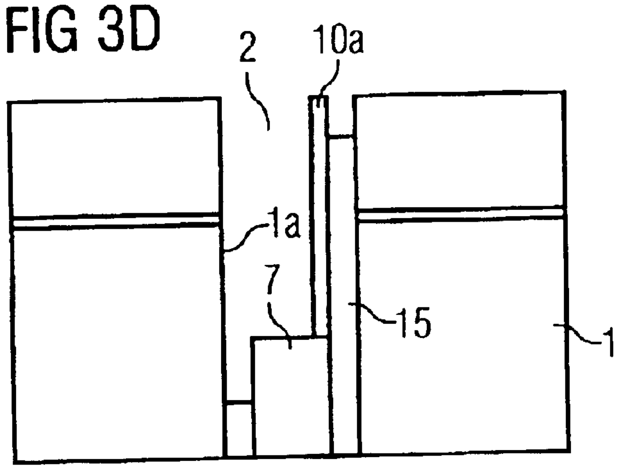
Figure 3E:
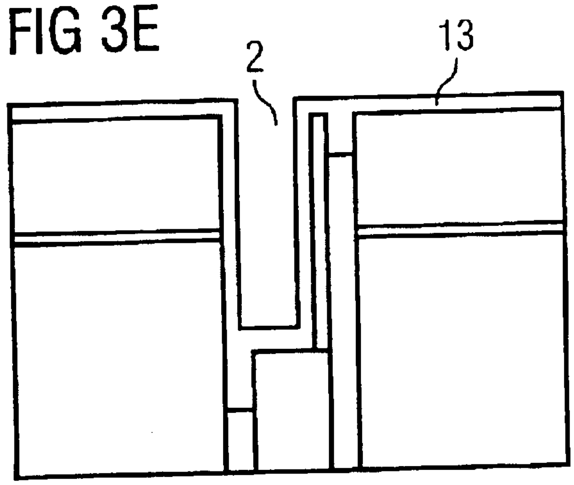
Figure 3F:
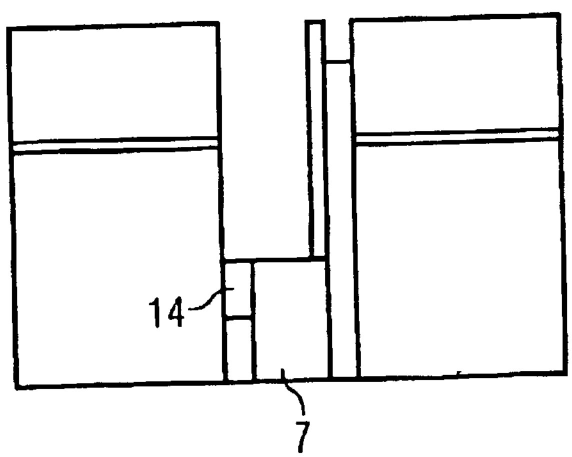

FIGS. 3A–3F show work steps for the construction of the trench capacitor, the top electrode being connected only toward one side of the trench. For this purpose, the work steps as have been described in the case of FIGS. 1A to 1E are run through. Afterward, the upper section of the trench 2 illustrated in FIG. 1E is lined with a ceramic collar material 15, which acts as an insulator in the completed capacitor. For this purpose, the collar material 15 may be deposited e.g. by a CVD method. Excess collar material which has been deposited on the top-side of the nitride layer 6 or the polysilicon 9 is subsequently removed again by anisotropic etching, so that the top side of the polysilicon 7 is uncovered again. Polysilicon is then deposited again and subsequently etched back isotropically to attain the construction illustrated in FIG. 3A. In order to simplify the illustration, the illustration respectively shows only the topmost section of the trench. The trench 2 introduced into the silicon wafer 1 is illustrated in FIG. 3A. The layer 5 made of silicon dioxide and the layer 6 made of silicon nitride are once again disposed on the top side of the silicon wafer 1. The trench 2 is lined with the dielectric 15 in its upper region. The inner space of the trenches 2 is filled with polysilicon 7 for producing the top electrode. In order to be able to remove the dielectric 15 on one side, a ceramic layer made of $Al_2O_3$, for example, and acting as a liner 10 is applied, for example by a CVD method, and subsequently converted into a (poly)crystalline form by heat treatment. The liner 10 then has a high resistance toward an etching medium. The construction illustrated in FIG. 3B is obtained. The uncovered section of the trenches 2 and also the top-side of the semiconductor substrate are covered with a thin ceramic layer of a liner 10 made of $Al_2O_3$. Ions are then implanted into the liner 10 section by section. For this purpose, the semiconductor substrate or the liner 10 is irradiated anisotropically with ions, the direction of incidence of the ions being illustrated by arrows 8. The ions impinge on the surface of the semiconductor substrate in a specific direction, the direction 8 of incidence of the ions forming a specific angle 11 with a normal 12 to the substrate surface. The penetration depth of the ions into the trenches 2 can be determined by the angle 11. Since a section 10A of the liner 10 is shaded from the incident ions 8 owing to the inclined direction of incidence, the structure of the difficult-to-etch (poly)crystalline $Al_2O_3$ is not altered in the sections 10*a* of the liner 10. However, the sections 10*b*—opposite the sections 10*a*—of the liner 10 disposed in the trench 2 are struck by the incident ions, with the result that the $Al_2O_3$ is converted into an easy-to-etch quasi-amorphous form in this region. After the implantation of the ions, an etching medium is again applied to the wafer, for example HF, in order to strip away the modified quasi-amorphous sections 10*b* of the liner 10. In this case, the dielectric 15 is also stripped away in the unprotected regions. This state is illustrated in FIG. 3D. In the upper section of the trenches 2, the liner 10 has been preserved only in the sections 10*a* in which ions were not implanted. The dielectric 15 has been preserved in the sections protected by the liner 10*a*, while it has been removed in the uncovered sections. As a result, the material of the silicon wafer 1 has been uncovered in the upper section of the trenches 2 only on one side in the section 1*a*. A thin layer of polysilicon 13 is then deposited again, which layer, as illustrated in FIG. 3E, covers the upper side of the semiconductor substrate and also the uncovered walls of the trench 2. The polysilicon 13 is then etched back isotropically again, so that, as illustrated in FIG. 3F, it is removed again from the top side of the semiconductor substrate and also the inner walls of the trench 2 and remains only in a small section 14 in the trench 2. An electrical connection to the polysilicon 7 of the later top electrode can then be produced via the section 14.

Figure 4A:
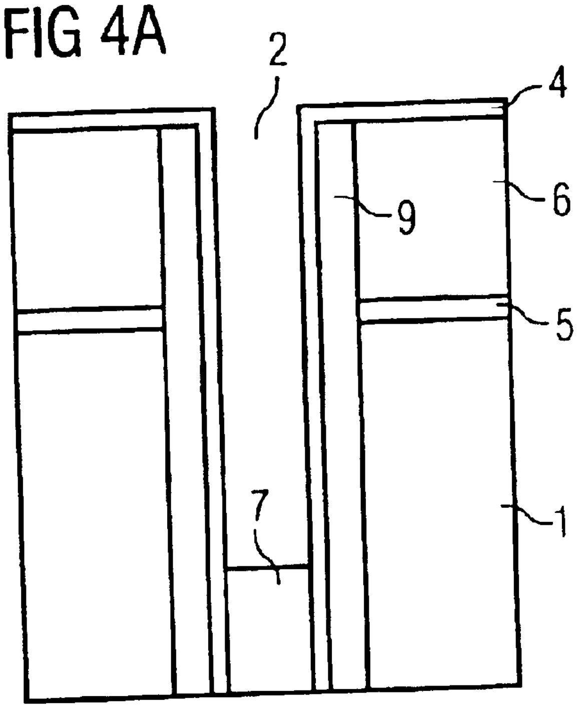
FIGS. 4A–4E are diagrammatic, sectional views showing method steps in the fabrication of the one-side buried strap, the capacitor being constructed by the method steps illustrated in FIG. 2.
Figure 4B:
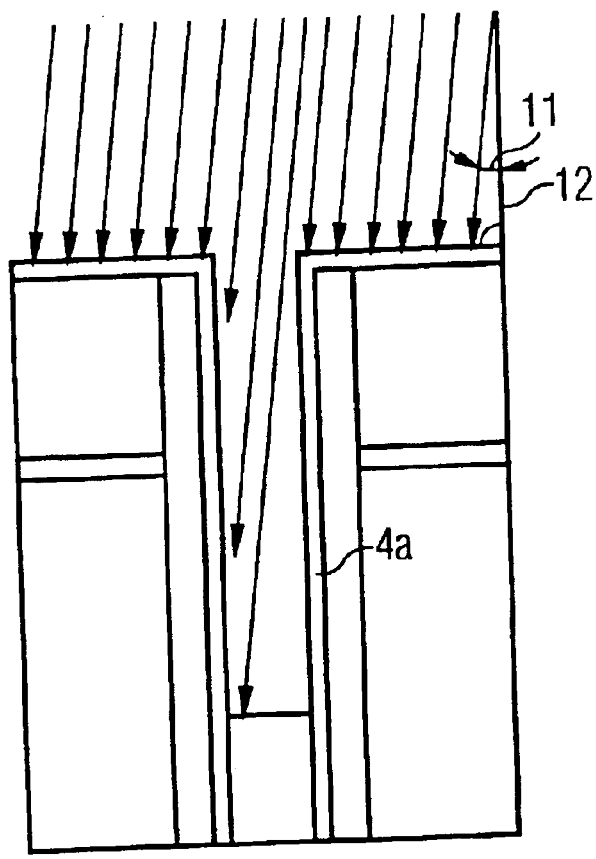
Figure 4C:
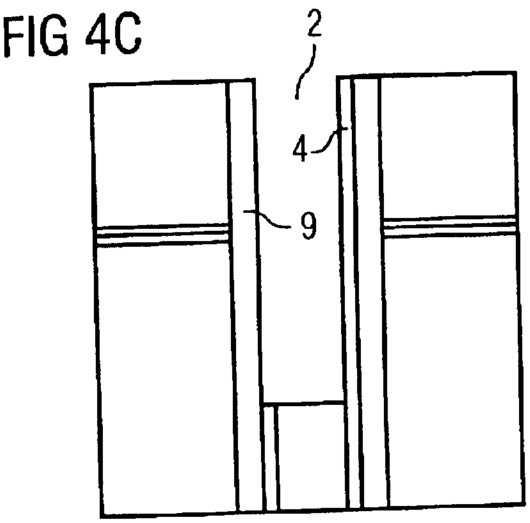
Figure 4D:
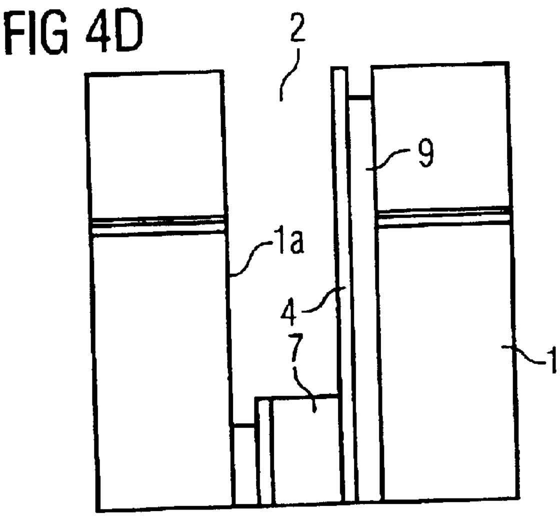
Figure 4E:
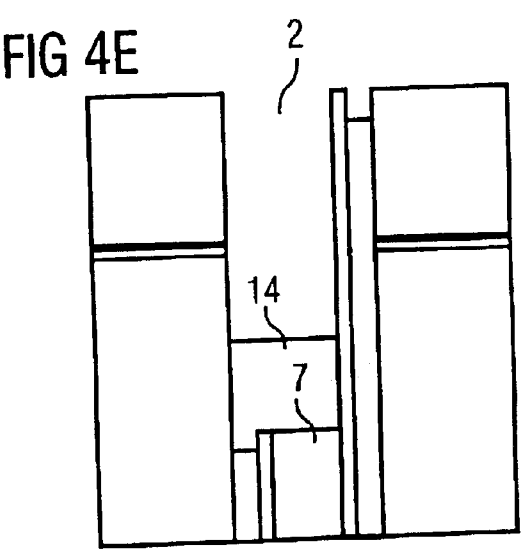

One possibility for producing a one-sided connection of the top electrode, proceeding from the configuration illustrated in FIG. 2B is shown in FIGS. 4A–4E. In this case, FIG. 4A corresponds to the upper section of the configuration illustrated in FIG. 2B. The thin layer 5 made of $SiO_2$ and also the layer 6 made of silicon nitride are disposed on the silicon wafer 1. The trenches 2 are introduced into the semiconductor configuration, the wall of which trenches is lined with the collar 9. Disposed on the collar 9 is the ceramic layer 4 which extends both over the upper side of the semiconductor configuration and along the inner side of the trench 2. The ceramic layer 4 corresponds to the ceramic layer acting as dielectric between the top electrode and the bottom electrode in the completed capacitor. The polysilicon 7 of the top electrode is illustrated in the lower section of the figure. In order to selectively alter sections of the ceramic layer 4 in its structure, ions are then implanted, the ions being incident in an inclined manner at an angle 11 to the normal 12 to the surface of the substrate. As a result, a section 4*a* of the ceramic layer is shaded from the incident ions, so that no modification of the structure takes place in this region. In the regions of the ceramic layer 4 which are struck by the ions, the dielectric is converted from its (poly)crystalline form into a quasi-amorphous form again. Then, first the quasi-amorphous sections of the ceramic layer 4 that have been modified by the ion bombardment are selectively removed by use of an etching medium. HF, for example, may be used as the etching medium. The construction illustrated in FIG. 4C is obtained. In the trench 2, the ceramic layer 4 has been removed on one side, so that the material of the collar 9 is uncovered in this section. The collar material is then etched, so that the material of the collar 9 is removed in the uncovered sections and a construction as illustrated in FIG. 4D is attained. The material of the silicon wafer 1 has now been uncovered on one side in a section 1*a* in the trench 2, the side of the wall of the trench 2 that is opposite the section 1*a* being protected by the layer 4 of the dielectric and the material of the collar 9. For the electrical connection of the polysilicon 7 of the top electrode, the trench 2 is then filled with polysilicon again and the polysilicon is subsequently etched back isotropically. A section 14 made of polysilicon is deposited on the polysilicon 7 of the later top electrode, which section produces an electrical connection to the polysilicon 7 of the top electrode. The construction illustrated in FIG. 4E is attained.

Figure 5A:
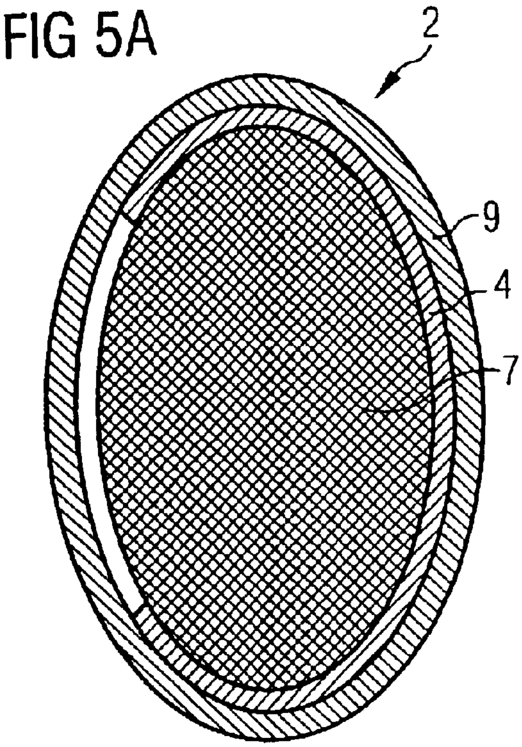
FIGS. 5A and 5B are plan views showing various work steps in the fabrication of the deep trench capacitor, the modification of the ceramic layer being effected by inclined implantation.
Figure 5B:
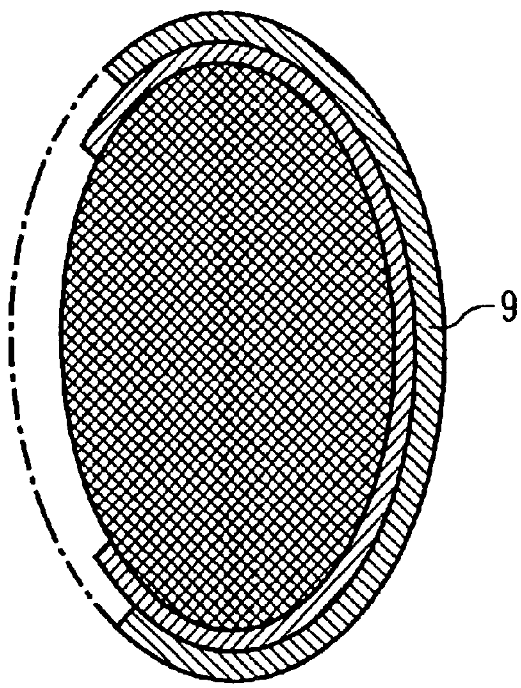

FIGS. 5A and 5B illustrate plan views of the trench 2. In this case, FIG. 5A corresponds to the state illustrated in FIG. 4C. The surface of the polysilicon 7 and also the ceramic layer 4 of the dielectric and also the layer of the collar 9 can be seen within the trench 2. By the inclined implantation of ions and subsequent etching, the ceramic layer 4 of the dielectric has been removed on one side of the trench 2, so that the material of the collar 9 is uncovered in this region. The uncovered material of the collar 9 can be attacked by an etching medium and removed. This is illustrated in FIG. 5B. The material of the collar 9 has been removed in that part of the wall of the trench 2 that is not covered by the ceramic layer 4 of the dielectric. In this case, the ceramic layer 4 of the dielectric has been undercut in the boundary region since here the material of the collar 9 is likewise not protected by the layer 4 of the dielectric.

By virtue of the inclined implantation, the modification of the ceramic layer is self-aligning and thus independent of lithographic alignment accuracies and CD variations. By virtue of the implantation of ions or of imperfections, the etching rate of the ceramic layer can be increased by more than one order of magnitude. Since, in the case of one-sided patterning of ceramic layers for example in trenches for trench capacitors, the implanted part of the layer is converted into an etchable form, the layer is removed on less than half the extent of the trench. Improved process tolerances are thus obtained. The layer used to produce a one-sided transistor connection can simultaneously be used as storage dielectric. An additional increase in the process complexity is thus avoided. The combination of amorphization and chemical alteration of the layer by the implantation of implant species containing both heavy atoms and hydrogen enables a further reduction of the complexity of the method according to the invention.

We claim:

1. A method for patterning ceramic layers on semiconductor substrates, which comprises the steps of:

providing a semiconductor substrate;

composing a ceramic layer of a material of high permittivity selected from the group consisting of $Al_2O_3$, $Ta_2O_5$, $ZrO_2$, $HfO_2$, $TiO_2$, oxides of lanthanides and mixed oxides thereof;

depositing the ceramic layer on the semiconductor substrate;

densifying the ceramic layer in a densification step resulting in a densified ceramic layer;

producing imperfections at least in sections in the densified ceramic layer by introducing an implant species into the densified ceramic layer by ion implantation; and treating the densified ceramic layer with an etching medium for removing the densified ceramic layer from the semiconductor substrate in the sections provided with the imperfections.

2. The method according to claim 1, which further comprises introducing the implant species into the densified ceramic layer by plasma.

3. The method according to claim 1, which further comprises introducing the implant species into the densified ceramic layer in a manner directed at an angle to a normal to a semiconductor substrate surface.

4. The method according to claim 3, which further comprises choosing the angle to be in a range of from 30° to 89°.

5. The method according to claim 3, wherein the semiconductor substrate has an uneven topography and regions of the densified ceramic layer are shaded as a result of an incidence of the implant species at the angle to the semiconductor substrate surface being obtained, and the regions having no imperfections in the densified ceramic layer.

6. The method according to claim 1, which further comprises converting the ceramic layer into one of a crystalline form and a polycrystalline form during the densification step.

7. The method according to claim 1, which further comprises performing the densification step of the ceramic layer via a heat treatment step.

8. The method according to claim 1, which further comprises removing the sections of the densified ceramic layer having the imperfections using a wet-chemical method.

9. The method according to claim 1, which further comprises:

forming trenches defined by walls into the semiconductor substrate;

depositing the ceramic layer on at least the walls and subsequently densifying the ceramic layer in the densification step; and applying the implant species at an inclination with respect to a normal to a substrate surface, so that the imperfections are produced only in sections in the trenches in the ceramic layer deposited on the walls of the trench.

10. The method according to claim 1, which further comprises forming the implant species with heavy elements for bringing about a chemical alteration of the ceramic layer.

11. The method according to claim 1, which further comprises disposing a further layer made of a further material below the ceramic layer.

* * * * *